United States Patent
Wu et al.

(10) Patent No.: US 12,463,085 B2
(45) Date of Patent: Nov. 4, 2025

(54) SUPPORT RING WITH PLASMA SPRAY COATING

(71) Applicant: Applied Materials, Inc., Santa Clara, CA (US)

(72) Inventors: Jian Wu, San Jose, CA (US); Toshiyuki Nakagawa, Narita (JP); Koji Nakanishi, Taito-Ku (JP)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/106,739

(22) Filed: Feb. 7, 2023

(65) Prior Publication Data

US 2023/0187262 A1 Jun. 15, 2023

Related U.S. Application Data

(62) Division of application No. 16/294,603, filed on Mar. 6, 2019, now Pat. No. 11,594,445.

(60) Provisional application No. 62/642,353, filed on Mar. 13, 2018.

(51) Int. Cl.
| | |
|---|---|
| H01L 21/687 | (2006.01) |
| C23C 16/24 | (2006.01) |
| C23C 16/50 | (2006.01) |
| H01L 21/67 | (2006.01) |

(52) U.S. Cl.
CPC ........ *H01L 21/68757* (2013.01); *C23C 16/24* (2013.01); *C23C 16/50* (2013.01); *H01L 21/67115* (2013.01); *H01L 21/68735* (2013.01); *H01L 2221/683* (2013.01)

(58) Field of Classification Search
CPC ........ H01L 21/68757; H01L 21/68735; H01L 2221/683; C23C 16/24; C23C 16/50
USPC .............................. 118/715–733; 250/492.2
See application file for complete search history.

(56) References Cited

U.S. PATENT DOCUMENTS

| | | | |
|---|---|---|---|
| 6,110,025 A | 8/2000 | Williams et al. | |
| 6,200,388 B1 | 3/2001 | Jennings | |
| 6,264,467 B1 | 7/2001 | Lue et al. | |
| 6,395,363 B1 * | 5/2002 | Ballance | H01L 21/68735 118/728 |
| 7,713,841 B2 | 5/2010 | Wood et al. | |
| 7,867,356 B2 | 1/2011 | Tong et al. | |
| 8,057,602 B2 | 11/2011 | Koelmel et al. | |
| 9,330,955 B2 | 5/2016 | Behdjat et al. | |
| 10,482,305 B1 * | 11/2019 | Matsuyuki | G06V 40/1329 |
| 2006/0090706 A1 | 5/2006 | Miller et al. | |

(Continued)

FOREIGN PATENT DOCUMENTS

| | | |
|---|---|---|
| CN | 1574208 A | 2/2005 |
| CN | 102210017 A | 10/2011 |

(Continued)

OTHER PUBLICATIONS

Office Action from Taiwan Patent Application No. 112121178 dated Oct. 5, 2023.

(Continued)

*Primary Examiner* — Charlee J. C. Bennett
(74) *Attorney, Agent, or Firm* — Patterson + Sheridan, LLP

(57) ABSTRACT

The present disclosure relates to a support ring for a thermal processing chamber. The support ring has a polysilicon coating. The polysilicon coating is formed using a plasma spray deposition process.

15 Claims, 3 Drawing Sheets

FIG 3

(56) References Cited

U.S. PATENT DOCUMENTS

| | | | |
|---|---|---|---|
| 2006/0102613 A1* | 5/2006 | Kuibira | H05B 3/12 |
| | | | 219/444.1 |
| 2009/0296774 A1 | 12/2009 | Koelmel et al. | |
| 2014/0094039 A1* | 4/2014 | Ranish | H05B 3/0047 |
| | | | 438/795 |
| 2014/0265101 A1* | 9/2014 | Pan | H01L 21/67115 |
| | | | 269/302 |
| 2015/0079370 A1* | 3/2015 | Sun | C23C 4/18 |
| | | | 427/454 |
| 2015/0187630 A1* | 7/2015 | Behdjat | H01L 21/68735 |
| | | | 269/302 |
| 2016/0247708 A1 | 8/2016 | Behdjat et al. | |
| 2017/0162422 A1* | 6/2017 | Raj | H01L 21/68735 |
| 2017/0218779 A1 | 8/2017 | Luthra et al. | |
| 2017/0253974 A1 | 9/2017 | Canniff | |
| 2017/0301520 A1 | 10/2017 | Sun et al. | |
| 2020/0251375 A1* | 8/2020 | Ranish | H01L 21/67248 |
| 2023/0295789 A1* | 9/2023 | Jorgensen | C23C 4/04 |
| | | | 269/289 R |

FOREIGN PATENT DOCUMENTS

| | | |
|---|---|---|
| CN | 103718283 A | 4/2014 |
| CN | 104718610 A | 6/2015 |
| CN | 104871305 A | 8/2015 |
| CN | 105453248 A | 3/2016 |
| CN | 105684133 A | 6/2016 |
| CN | 105830207 A | 8/2016 |
| JP | 2009054984 A | 3/2009 |
| JP | 4511724 B2 | 7/2010 |
| JP | 4669606 B2 | 4/2011 |
| JP | 5482282 B2 | 5/2014 |
| JP | 2014523143 A | 9/2014 |
| KR | 20160083079 A | 7/2016 |
| KR | 20160103128 A | 8/2016 |
| TW | 201306144 A | 2/2013 |
| TW | 201532183 A | 8/2015 |
| TW | 201800596 A | 1/2018 |

OTHER PUBLICATIONS

International Search Report and Written Opinion for Application No. PCT/US2019/020998 dated Jun. 14, 2019.

Taiwan Office Action dated Dec. 8, 2022, for Taiwan Patent Application No. 108108416.

Office Action from Chinese Patent Application No. 201980017607.1 dated Oct. 28, 2023.

Office Action from Korean Patent Application No. 10-2020-7029330 dated Nov. 9, 2023.

Office Action from Chinese Patent Application No. 201980017607.1 dated Mar. 19, 2024.

Office Action from Chinese Patent Application No. 201980017607.1 dated Jul. 27, 2024.

* cited by examiner

SUPPORT RING WITH PLASMA SPRAY COATING

CROSS-REFERENCE TO RELATED APPLICATIONS

This application is a divisional of U.S. patent application Ser. No. 16/294,603, filed Mar. 6, 2019, which claims benefit of U.S. provisional patent application Ser. No. 62/642,353, filed Mar. 13, 2018, each of which is herein incorporated by reference in its entirety.

BACKGROUND

Field

Aspects of the present disclosure relate generally to devices used to support substrates and methods for forming such devices. More particularly, embodiments of the present disclosure relate to a support ring with a polysilicon coating.

Description of the Related Art

In the processing of substrates, such as for manufacturing semiconductor devices, a semiconductor substrate is placed on a substrate support in a processing chamber while suitable processing conditions are maintained therein. In one example, a rapid thermal processing (RTP) chamber may be used to heat the substrate utilizing lamps disposed below the substrate. The substrate may be rapidly heated to an elevated temperature within a temperature range of 600° C. to 1300° C. using electromagnetic energy emitted from the lamps. During processing, the substrate is supported by a supporting structure, such as an edge ring, disposed around, and supporting, the periphery of the substrate. The edge ring is further supported by another supporting structure, such as a support ring.

The edge ring and support ring are constructed of materials that can withstand numerous cycles of rapid heating and cooling. Quartz is a common material used for the support ring structure. Radiation detectors that are sensitive to radiation emitted by the substrate are often used in the area above the substrate to determine the temperature of the substrate. Preventing lamp radiation from entering the area above the substrate prevents such radiation from hampering performance of the radiation detectors. Because quartz is transparent to light and infrared energy, the quartz support ring may be coated with a material to render it opaque to the lamp radiation.

Deposition processes, such as chemical vapor deposition (CVD), are commonly used to form the coatings. However, such conventional processes suffer from many limitations. For example, the size of the ring to be coated is limited by the size of the deposition chamber used to form the coating. Additionally, select regions of a ring are often uncoated. CVD processes involve expensive and time consuming formation of masks on the ring to prevent coatings from being deposited on the masked portions thereof.

Coatings formed using conventional methods, such as CVD, also suffer from issues with adhesion of the coating to an underlying surface. CVD silicon coatings begin to delaminate and/or crack after the part on which the silicon coatings were formed is repeatedly thermally cycled. Such delamination and cracking may begin to develop after only a few thermal cycles. Continued delamination or cracking eventually renders the quartz support rings coated with silicon unusable.

Accordingly, there exists a need for improved coatings for quartz support rings.

SUMMARY

In one aspect, a processing chamber includes a body having a sidewall and a bottom. A lid is coupled to the body to define a processing volume therein. A radiant heat source is disposed on the bottom in the processing volume for heating a substrate during a processing operation. A substrate support is also disposed in the processing volume. The substrate support has an edge ring, a support ring, and a support cylinder coupled to the support ring. The support ring includes a coating formed thereon using a plasma spray deposition process.

In another aspect, a substrate support includes a ring body having inner edge, an outer edge, a first side extending between the inner edge and the outer edge, and a second side extending between the inner edge and outer edge opposite from the first side. A coating is disposed on the ring body. The coating is formed by a plasma spray deposition process.

In another aspect, a method of forming a coating on a support ring made of quartz is disclosed. The method includes cleaning a support ring, positioning the support ring to a deposition area, wherein the deposition area is a clean room, and applying the coating using a plasma spray deposition process.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure relates to a support ring for a thermal processing chamber. The support ring has a polysilicon coating for limiting transmission of electromagnetic radiation by the support ring. The polysilicon coating is formed using a plasma spray deposition process.

Figure 1:
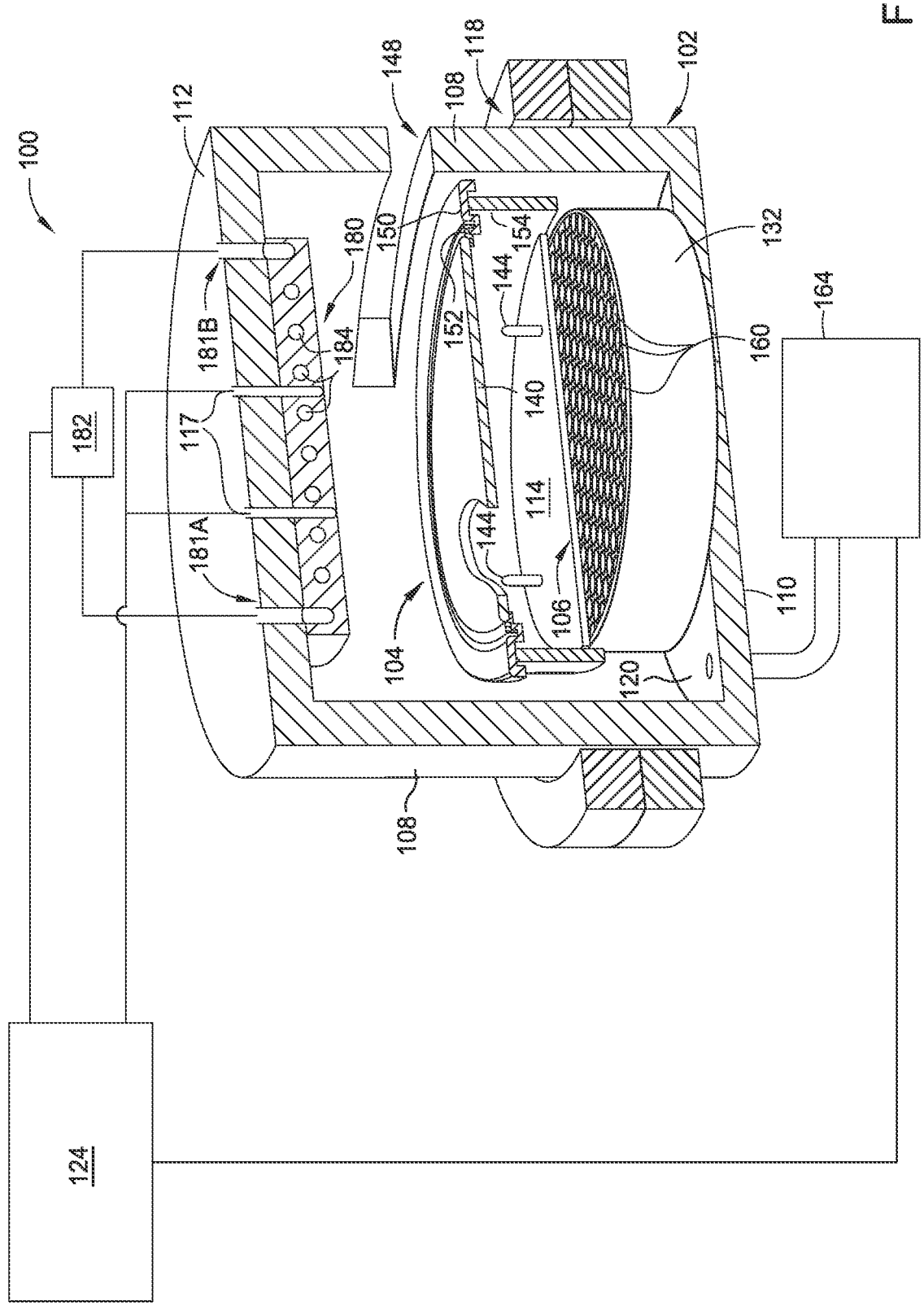
FIG. 1 is a simplified isometric view of a rapid thermal processing chamber according to one embodiment of the disclosure.

FIG. 1 depicts a simplified isometric view of a rapid thermal processing chamber 100 according to one embodiment. The processing chamber 100 includes a chamber body 102 having walls 108, a bottom 110, and a lid 112 defining a processing volume 120. The walls 108 include a port 148 to facilitate ingress and egress of a substrate 140 with respect to a substrate support 104 disposed in the processing volume 120. The port 148 may be coupled to a transfer chamber (not shown) or a load lock chamber (not shown) and may be selectively sealed with a valve, such as a slit valve (not shown), or another isolation device.

A cooling block 180 is coupled to the lid 112. One or more coolant channels 184 are formed in the cooling block 180 and are in fluid communication with a coolant source 182 through an inlet port 181A and an outlet port 181B. The cooling block 180 may be made of a process environment resistant material, such as stainless steel, aluminum, a polymer, or a ceramic material, among others. A fluid, such as water, ethylene glycol, nitrogen ($N_2$), or helium (He), among others, is flowed through the coolant channels 184 in order to maintain the cooling block 180 at a specified temperature or within a specified temperature range.

A radiant heat source 106 is disposed in the processing volume 120 and coupled to the chamber bottom 110. The radiant heat source 106 includes a lamp assembly formed from a housing 132, a window 114, and a plurality of tubes 160. Each tube 160 contains a reflector and an electromagnetic (EM) radiation source, such as a lamp. Here, the tubes 160 are arranged in a honeycomb arrangement. However, other arrangements of the tubes 160 may be utilized. The radiant heat source 106 may further be divided into heating zones, such as concentric rings of EM radiation sources, wherein the EM radiation sources disposed in tubes 160 are controlled to emit different levels of EM radiation.

The window 114 and the housing 132 isolate the tubes 160 from the processing volume 120. The window 114 is made from a material that is substantially transparent to the EM radiation emitted by the radiant heat source 106 which is used to heat the substrate 140. The window 114 is typically made of quartz, although other materials, such as sapphire, may be used. Lift pins 144 are provided to selectively contact and support the substrate 140 to facilitate transfer of the substrate 140 onto, or removal from, the substrate support 104.

The substrate support 104 is disposed between the radiant heat source 106 and the cooling block 180. The substrate support 104 includes a support cylinder 154, a support ring 150, and an edge ring 152. The support ring 150 rests on the support cylinder 154. The edge ring 152 rests on, and is nested with, the support ring 150. The edge ring 152 has a substrate support surface for receiving the substrate 140 for processing thereof. The edge ring 152 is typically formed of quartz, amorphous silica, or silicon carbide, though other materials may be used. Similarly, the support ring 150 is typically formed from quartz or amorphous silica, though other materials may be used. Further, the support ring 150 is coated with a polysilicon coating. Details of the support ring 150 and the polysilicon coating are discussed in reference to FIGS. 2 and 3.

A stator assembly 118 is disposed externally of the chamber body 102 and circumscribes the walls 108 thereof. The stator assembly 118 is magnetically coupled to the substrate support 104 disposed within the processing volume 120 of the chamber body 102. The substrate support 104 incudes a magnetic portion that functions as a rotor, thus forming a magnetic coupling to lift and/or rotate the substrate support 104. The stator assembly 118 is adapted to rotate and/or raise/lower the substrate support 104 using the magnetic coupling therebetween. The stator assembly 118 has a plurality of electric coils therein (not shown). During operation, the stator assembly 118 applies a sequence of electric currents to the coils at defined intervals. The electric currents within the coils create a series of magnetic fields which are coupled to the magnetic portion of the substrate support 104. The electric currents are applied to the coils in a sequence so that the magnetic fields formed therein attract the magnetic portion of the substrate support 104 and bias the substrate support 104 to rotate about a vertical axis.

An atmosphere control system 164 is also coupled to the processing volume 120 of the chamber body 102. The atmosphere control system 164 may include valves and/or vacuum pumps for controlling chamber pressure. The atmosphere control system 164 may also include a gas source for providing process gases or other types of gases to the processing volume 120.

The processing chamber 100 also includes one or more sensors 117 configured to detect EM radiation. A property of the detected EM radiation, such as wavelength or intensity measured by the sensors 117, is used by a controller 124 to inferentially determine the temperature of the substrate 140 before, during, and/or after processing. Here, the sensors 117 are disposed through the lid 112, although other locations within and around the chamber body 102 may be used. The sensors 117 are, for example, pyrometers. The sensors 117 may be arranged in a pattern defining sensing areas which correspond to the heating zones defined for the radiant heat source 106. For example, an array of sensors 117 may be coupled to the lid 112 in a radial configuration to define sensing areas across the substrate 140 arranged as concentric rings.

During operation, the substrate 140 is loaded into the processing chamber 100 and onto the substrate support 104. The radiant heat source 106 heats the substrate 140 to a desired processing temperature while the substrate support 104 is rotated by the stator assembly 118 thus rotating the substrate 140 about a center thereof. A gas is flowed into the chamber to deposit a new layer or modify a previously deposited layer on the substrate 140. After completion of the processing operation, the substrate 140 may undergo another processing operation within the processing chamber 100. After processing of the substrate 140 is complete, the substrate 140 is removed from the processing chamber 100.

Figure 2:
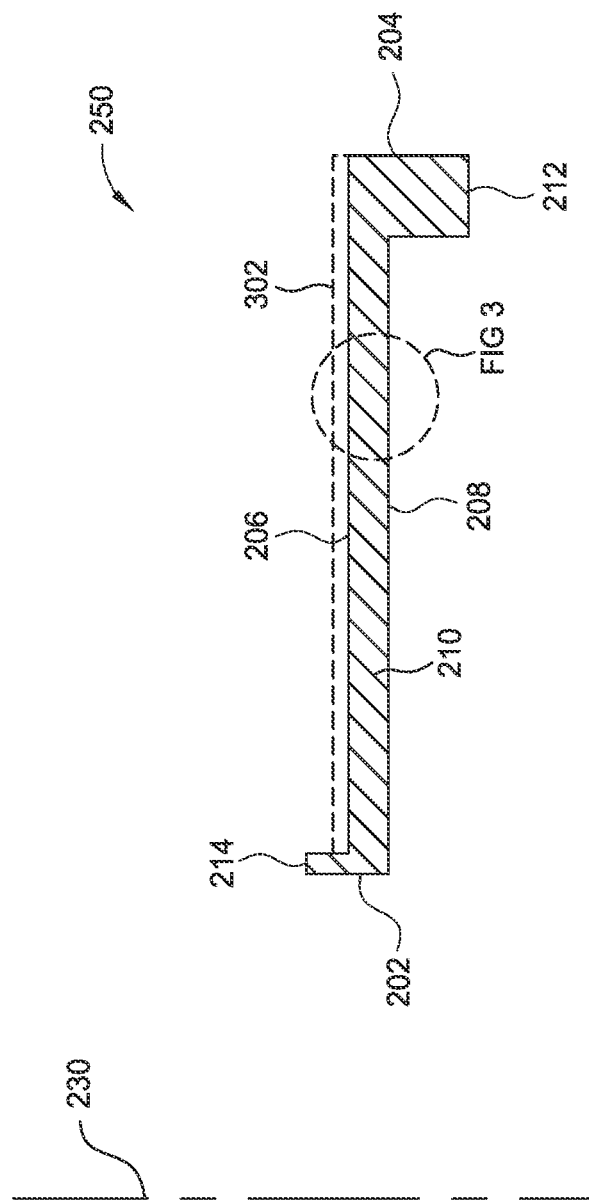
FIG. 2 is a partial cross-section of a support ring according to one embodiment of the disclosure.

FIG. 2 is a cross-section of a support ring 250 according to one embodiment. The support ring 250 may be used in the rapid thermal processing chamber 100. The support ring 250 is an annular member having a ring body 210 defined by an inner surface 202 and an outer surface 204. The inner surface 202 and the outer surface 204 are concentric about a central axis 230 of the support ring 250. The ring body 210 also has a first side 206 and a second side 208 which extend between, and couple to, a first annular shoulder 214 and a second annular shoulder 212.

The first annular shoulder 214 is formed on the ring body 210 on the first side 206, and extends therefrom, at a junction between the first side 206 and the inner surface 202. The first annular shoulder 214 extends away from a plane substantially defined by the first side 206 of the ring body 210 in a direction representatively upward (i.e., away from the second side 208). In one embodiment, the first annular shoulder 214 extends away from the first side 206 in a substantially perpendicular direction. The first annular shoulder 214 engages with a complimentary projection on a mating support member (not shown), such as the edge ring 152 of FIG. 1.

The second annular shoulder 212 is formed on the ring body 210 on the second side 208 thereof, and extends therefrom at a junction between the second side 208 and the outer surface 204. Here, the second annular shoulder 212 extends away from a plane substantially defined by the second side 208 of the ring body 210 in a direction representatively downward and opposite to the direction of extension of the first annular shoulder 214. The second annular shoulder 212 engages with a third support member (not shown), such as the support cylinder 154 of FIG. 1. Therefore, the annular shoulders 212, 214 provide secure positioning for the support ring 250 in relation the edge ring 152 and the support cylinder 154.

The ring body 210 of the support ring 250 is formed from a material such as quartz, silicon carbide, silicon oxide, or ceramic, among others. Such materials are used to form the ring body 210 for desired material properties thereof, such as resistance to degradation caused by the high temperatures of thermal processing of substrates and/or thermal expansion characteristics. However, such materials are also transmissive to the EM radiation used for thermal processing. During processing, it is desirable to limit or even prevent the transmission of EM radiation through the support ring 250 in order to improve the detection of radiation by sensors used to determine temperature of a substrate, such as the sensors 117 of FIG. 1. A coating 302 is disposed on the first side 206 in order to make the support ring 250 partially or fully opaque to some, or even all, wavelengths of the EM radiation, as further described in relation to FIG. 3.

Figure 3:
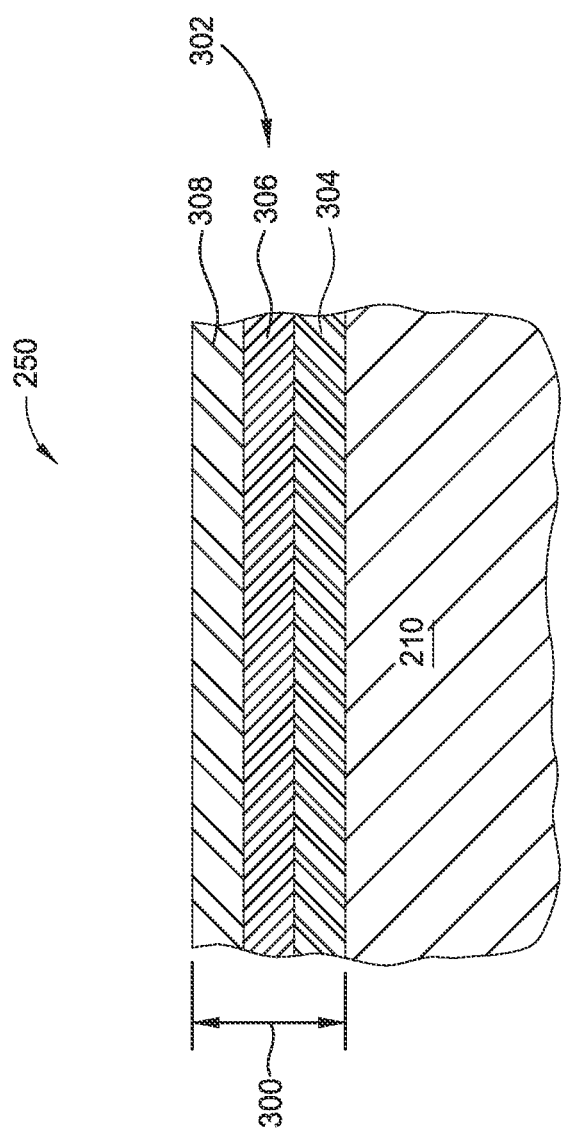
FIG. 3 is a partial cross-section on an enlarged portion of the support ring of FIG. 2.

FIG. 3 is a partial cross-section of an enlarged portion of the support ring 250 having a coating 302. In one embodiment, the coating 302 is formed from a polycrystalline silicon (polysilicon) material. The coating 302 has a thickness 300 between about 10 microns and about 200 microns, such as between about 10 microns and about 150 microns. For example, the coating has a thickness of between about 20 microns and about 120 microns, such as between about 50 microns and about 100 microns. Here, the coating 302 is formed from three layers including a first layer 304, a second layer 306, and a third layer 308. Each layer 304, 306, 308 is formed of the same material from an individual cycle (i.e., "pass") of a plasma spray deposition process. Further, each layer 304, 306, 308 is substantially equal in thickness. However, it is contemplated that the coating 302 may be formed from a single layer or any other number of layers, such as two layers, four layers, or five layers. Still further, multiple coatings may be formed on the support ring 250. It is also contemplated that each coating and/or layer may be formed of a different material or combination of materials, and that each coating and/or layer may have a different thickness.

In one embodiment, the coating 302 is uniformly formed on the entire surface of the ring body 210. In another embodiment, the coating 302 is formed on selective locations of the ring body 210. For example, the coating 302 may be disposed on the first side 206, on the second side 208, or on both the first side 206 and the second side 208. In one embodiment, the coating 302 has a uniform thickness throughout. For example, the coating 302 has a thickness variation of within plus or minus 20%, such as a thickness variation of within plus or minus 15%, such as a thickness variation of within plus or minus 10%, such as a thickness variation of within plus or minus 5%. In one embodiment, the coating 302 has a thickness variation of within plus or minus 40 microns, such as a thickness variation of within plus or minus 30 microns, such as a thickness variation of within plus or minus 20 microns, such as a thickness variation of within plus or minus 10 microns, such as a thickness variation of within plus or minus 5 microns, such as a thickness variation of within plus or minus 3 microns. In another embodiment, the coating 302 has a non-uniform thickness throughout. For example, the coating 302 may have an inner region with a first uniform thickness and an outer region with a second uniform thickness different than the first uniform thickness. In another embodiment, the coating 302 has a linearly increasing thickness from a first end at an inner surface, such as inner surface 202, to a second end at a radially outward surface, such as outer surface 204.

The coating 302 is configured in relation to desired optical properties, such as refractivity or opacity, for reducing or preventing transmission of emitted EM radiation. For example, the thickness and materials of the coating 302 can be selected to prevent transmission of wavelengths of EM radiation in the operating range of sensors, such as radiation detectors. In one embodiment, the coating 302 has an optical density of four or greater.

The coating 302 is formed using a plasma spray deposition method. In an exemplary method, a part, such as the ring body 210, is first cleaned. The part is then supplied to a deposition area, such as a clean room or vented hood, wherein contaminant particles are controlled to prevent deposition thereof onto the cleaned part. The coating is then applied to the part using a plasma spray deposition process. In one embodiment, the coating is applied with a spray angle that is about perpendicular to the surface to be coated, such as an angle within 10 degrees of an axis perpendicular to the surface being coated. For example, the coating may be applied with a spray angle within 5 degrees of an axis perpendicular to the surface being coated. During deposition, the deposition area is maintained at atmospheric pressure and temperature. The grain size of the powder used to form the coating is controlled. The grain size of the deposited coating affects the optical properties of the deposited layer. The coating material is polysilicon.

The plasma spray deposition method improves adhesion between the coating 302 and the ring body 210. Further, the size of the ring body 210 to be coated is not size limited by the plasma spray deposition method since deposition may be performed outside of a deposition chamber. Still further, the manufacturing costs of the coated support ring 250 are significantly reduced since the plasma spray deposition method may be performed at atmospheric pressure and temperature. In masking applications, when a portion of the ring body 210 is to remain uncoated, the plasma spray deposition method allows the use of cost effective masking techniques, such as application of a Teflon tape onto surfaces of a part where the coating is not desired to be formed, due to the atmospheric conditions used therewith which eliminates utilization of expensive masking jigs or the like. By using the plasma spray method described herein, the coating 302 is provided with good interfacial adhesion between the quartz support ring and the layers of coating formed thereon, low metal contamination in the coating material, and high optical density to reduce or prevent transmission of electromagnetic radiation.

While the foregoing is directed to embodiments of the present disclosure, other and further embodiments of the disclosure may be devised without departing from the basic scope thereof, and the scope thereof is determined by the claims that follow.

What is claimed is:

1. A support ring for a substrate processing chamber, the support ring comprising:
   an annular ring body formed of opaque quartz, the ring body comprising:
   an inner surface and an outer surface;
   a first side surface opposite a second side surface;
   a first annular shoulder disposed between the inner surface and the first side surface of the ring body, the first annular shoulder having a top surface disposed above the first side surface of the ring body; and a second annular shoulder of the ring body disposed between the outer surface and the second side surface of the ring body, the second annular shoulder having a bottom surface disposed below the second side surface of the ring body, the outer surface having a height greater than a height of the inner surface; and a coating selectively disposed on the first side surface of the ring body relative to the other surfaces of the ring body, wherein the first annular shoulder and the second side are uncoated; and wherein the coating has a uniform thickness between the first annular shoulder and the outer surface, the uniform thickness between about 10 microns and about 150 microns with a thickness variation within plus or minus 20%, the coating comprising a silicon material deposited by a plasma spray deposition process.

2. The support ring of claim 1, wherein the coating comprises a polycrystalline silicon material.

3. The support ring of claim 1, wherein the coating has a thickness between about 20 microns and about 120 microns.

4. The support ring of claim 1, wherein the coating has a thickness between about 50 microns and about 100 microns.

5. The support ring of claim 1, wherein the coating comprises more than one layer of silicon material deposited by the plasma spray deposition process.

6. The support ring of claim 1, wherein the coating has an optical density of at least 4.

7. A chamber for processing a substrate, comprising:
a body having a sidewall and a bottom;
a lid coupled to the body and partially defining a processing volume therein;
a substrate support disposed in the processing volume, the substrate support comprising:
   a support cylinder;
   an edge ring configured to support a substrate; and
   a support ring configured to support the edge ring and disposed on the support cylinder, the support ring comprising:
      an annular ring body formed of opaque quartz, the ring body comprising:
         an inner surface and an outer surface;
         a first side surface opposite a second side surface;
         a first annular shoulder disposed between the inner surface and the first side surface of the ring body, the first annular shoulder having a top surface disposed above the first side surface of the ring body; and
         a second annular shoulder of the ring body disposed between the outer surface and the second side surface of the ring body, the second annular shoulder having a bottom surface disposed below the second side surface of the ring body, the outer surface having a height greater than a height of the inner surface; and
      a coating selectively disposed on the first side surface of the ring body relative to other surfaces of the ring body, wherein the first annular shoulder and the second side are uncoated, and wherein the coating has a uniform thickness between the first annular shoulder and the outer surface, the uniform thickness between about 10 microns and about 150 microns with a thickness variation within plus or minus 20%, the coating comprising a silicon material deposited by a plasma spray deposition process.

8. The chamber of claim 7, wherein the second side surface of the annular ring body of the support ring is uncoated.

9. The chamber of claim 7, wherein the coating of the support ring comprises a polycrystalline silicon material.

10. The chamber of claim 7, wherein the coating of the support ring has a thickness between about 20 microns and about 120 microns.

11. The chamber of claim 10, wherein the coating of the support ring has a thickness between about 50 microns and about 100 microns.

12. The chamber of claim 7, wherein the coating of the support ring comprises more than one layer of silicon material deposited by the plasma spray deposition process.

13. The chamber of claim 7, wherein the coating of the support ring has an optical density of at least 4.

14. The support ring of claim 1, wherein the coating comprises:
a first layer in contact with the ring body; and
a second layer disposed on the first layer, the second layer having a thickness different from that of the first layer.

15. The chamber of claim 7, wherein the coating comprises:
a first layer in contact with the ring body; and
a second layer disposed on the first layer, the second layer having a thickness different from that of the first layer.

* * * * *